(12) United States Patent
Lang et al.

(10) Patent No.: US 8,838,430 B1
(45) Date of Patent: Sep. 16, 2014

(54) DETECTION OF MEMORY ACCESS VIOLATION IN SIMULATIONS

(75) Inventors: Tuay-Ling Kathy Lang, Boxborough, MA (US); Neeti K. Bhatnagar, San Jose, CA (US); Jai Bharat Patel Gulabeela, San Jose, CA (US); George F. Frazier, Lawrence, KS (US); Qizhang Chao, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 441 days.

(21) Appl. No.: 13/219,469

(22) Filed: Aug. 26, 2011

(51) Int. Cl.
*G06F 9/445* (2006.01)
*G06F 9/455* (2006.01)

(52) U.S. Cl.
USPC .................. 703/14; 703/22; 703/24

(58) Field of Classification Search
CPC .......... G06F 9/44547; G06F 9/45516
USPC ................................. 703/14, 22, 24
See application file for complete search history.

(56) References Cited

U.S. PATENT DOCUMENTS

| 2002/0103943 | A1* | 8/2002 | Lo et al. ............ 710/2 |
| 2009/0200367 | A1* | 8/2009 | Arnouse ............ 235/375 |
| 2011/0271312 | A1* | 11/2011 | Arnouse ............ 725/106 |
| 2013/0018644 | A1* | 1/2013 | Motel et al. ............ 703/14 |

\* cited by examiner

*Primary Examiner* — Thai Phan
(74) *Attorney, Agent, or Firm* — Holland & Knight LLP; Mark H. Whittenberger, Esq

(57) ABSTRACT

An apparatus and method for detecting memory access violations in simulations is disclosed herein. A detection tool is designed to automatically perform a violation check for each memory read or write operation simulated in a modeled system. The detection tool is capable of handling a modeled system including one or more memories and/or one or more processors.

33 Claims, 8 Drawing Sheets

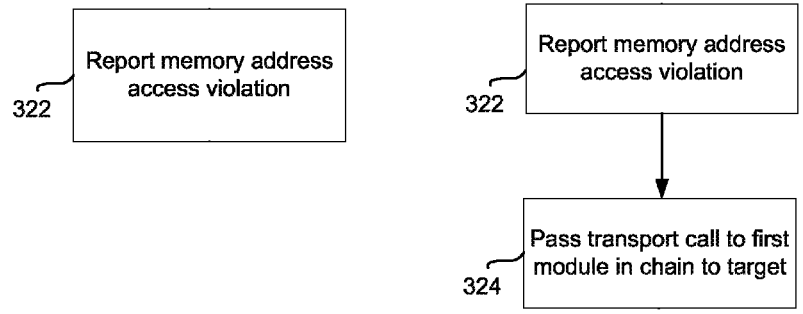
FIG. 3B
FIG. 3C
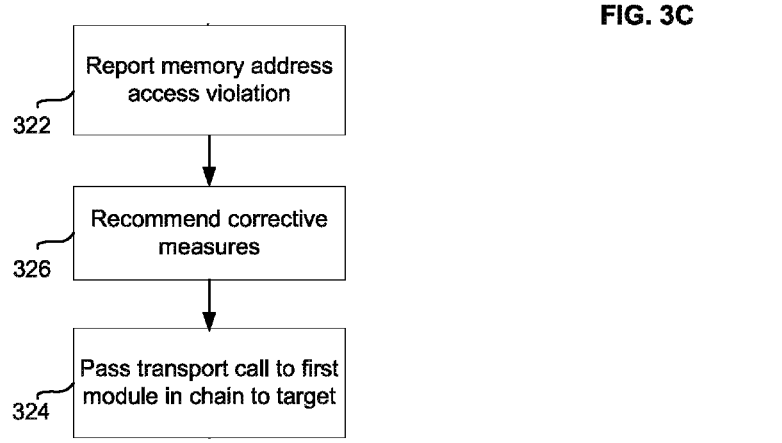
FIG. 3D

|  402  |  404  | 400 ↓ | 406 | 408 | 410 |
|---|---|---|---|---|---|
| PROGRAM_MEMORY | sc_main.program_memory.tsocket | | 0x0 | 0x0FFFF | 0 |
| MEMORY1 | sc_main.memory1.tsocket | | 0x0 | 0x0FFFF | 0x10000 |
| MEMORY2 | sc_main.memory2.tsocket | | 0x0 | 0x0FFFF | 0x20000 |

| 702 | | | | |
|---|---|---|---|---|
| @subsystem sc_main.processor0 | | | | |
| ROM | sc_main.memory0.tsocket | 0x0 | 0x0FFF | 0x10000 |
| RAM1 | sc_main.memory1.tsocket | 0x0 | 0x03FF | 0x21000 |
| RAM2 | sc_main.memory2.tsocket | 0x0 | 0x03FF | 0x22000 |
| @subsystem sc_main.processor2 | | | | |
| ROM | sc_main.memory0.tsocket | 0x0 | 0x0FFF | 0x10000 |
| RAM1 | sc_main.memory3.tsocket | 0x0 | 0x03FF | 0x30000 |
| RAM2 | sc_main.memory4.tsocket | 0x0 | 0x03FF | 0x33000 |

| | |
|---|---|
| m_command | Type of transaction. Three values are supported:<br>TLM_WRITE_COMMAND<br>TLM_READ_COMMAND<br>TLM_IGNORE_COMMAND |
| m_address | Transaction base address (byte addressing). |
| m_data | When m_command = TLM_WRITE_COMMAND contains a pointer to the data to be written in the target. When m_command = TLM_READ_COMMAND contains a pointer where to copy the data read from the target. |
| m_length | Total number of bytes of the transaction |
| m_response_status | Indicates whether an error has occurred during the transaction. Values are:<br>TLM_OK_RESP<br>TLM_INCOMPLETE_RESP<br>TLM_GENERIC_ERROR_RESP<br>TLM_ADDRESS_ERROR_RESP<br>TLM_COMMAND_ERROR_RESP<br>TLM_BURST_ERROR_RESP<br>TLM_BYTE_ENABLE_ERROR_RESP |
| m_byte_enable | Used to create burst transfers where the address increment between each beat is greater than the word length of each beat, or to place words in selected byte lanes of a bus. |
| m_byte_enable_length | For a read or a write command, the target interpret the byte enable length attribute as the number of elements in the bytes enable array. |
| m_streaming_width | Width of streaming data pulse |

FIG. 6

DETECTION OF MEMORY ACCESS VIOLATION IN SIMULATIONS

BACKGROUND

The present invention relates to the field of simulations. More particularly, the present invention relates to detecting errors present in simulations.

Simulations are used to model physical devices to facilitate device design, prototyping, and/or testing. A computer system typically runs simulations by executing a set of instructions or code representative of devices and the functionalities/interactions that occur between these devices. A modeled device may comprise a component on an integrated chip (e.g., a transistor, processor, bus, clock, memory, etc.), the entire integrated circuit (IC), a system including an IC, or other components of an electronic system. During simulation, devices are modeled as modules, and operations or transactions involving the devices may be modeled at a designer-specified level of detail. Transaction level modeling (TLM) specification by Open SystemC Initiative (OSCI) is an example of a discrete event simulation.

As devices become increasingly complex, designers correspondingly turn to simulators to increase design productivity. Errors can be introduced into the simulation either because there is a design flaw in the device being modeled or the coding of the design into the simulator is incorrect (thus, the model does not accurately reflect the design). This error may go unnoticed until the simulation is complete and results analyzed, the simulator crashes, or the designer manually notices the error. Given market demands for rapid design development, it would be beneficial for designers to become aware of such errors early in the simulation process rather than later.

For example, when simulating memory devices, early detection of memory access violations would be helpful in the design process. To effectively model memory devices, transport function calls representing read and write operations to and from memory are simulated. Transport function calls include address information specifying actions involving particular memory locations of a particular memory module. If the address information in a transport function call does not correspond to a valid memory location for the associated memory module, then the transport function call includes a memory access violation. Detection of such a memory access violation may indicate the presence of a design flaw and/or coding flaw in the model representing a device design.

Thus, it would be beneficial to provide early detection of memory access violations in simulations. A designer would benefit from knowing about a memory access violation in real-time or near real-time, preferably before the simulation is complete. Early detection of memory access violation serves as an effective debugging feature in a software debugging environment. Early detection of memory access violation also permits real-time or near real-time pin point of simulator error. Providing early detection information may allow the designer to make design changes or correct modeling of the design in the simulator as soon as possible, thereby potentially preventing a simulator crash or unnecessarily lengthening the overall design time. Another benefit is having the early detection feature automatically within a known simulation environment—the designer need not concern him or herself with additional or special code to perform special checks.

BRIEF SUMMARY

An apparatus and method for providing early detection of memory access violations occurring in simulations of device designs is disclosed herein. A tool automatically intercepts transport function calls involving memory devices. The tool checks the memory address information passed to each transport function call against a memory map. Memory address information inconsistent with the address space specified in the memory map represents a memory access violation. Each violation may be reported for debugging purposes to facilitate device design correction or more accurate modeling of the device design. The tool is capable of handling modeled systems implementing one or more memory devices and/or one or more processors. The tool integrates seamlessly with discrete event simulators, without requiring additional or special inputs or consideration by designers and others involved in setting up/running the simulations.

Other features and aspects of embodiments will become apparent from the following detailed description, taken in conjunction with the accompanying drawings which illustrate, by way of example, the features in accordance with the embodiments.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 3A-3G illustrates exemplary flow diagrams of a memory access violation detection tool according to some embodiments.

FIG. 4 illustrates an exemplary memory map used by the tool described in FIGS. 3A-3G.

FIG. 6 illustrates exemplary fields and field definitions for a TLM 2.0 generic payload object.

FIG. 7 illustrates an alternative exemplary memory map used by the tool described in FIGS. 3A-3G.

Figure 1:
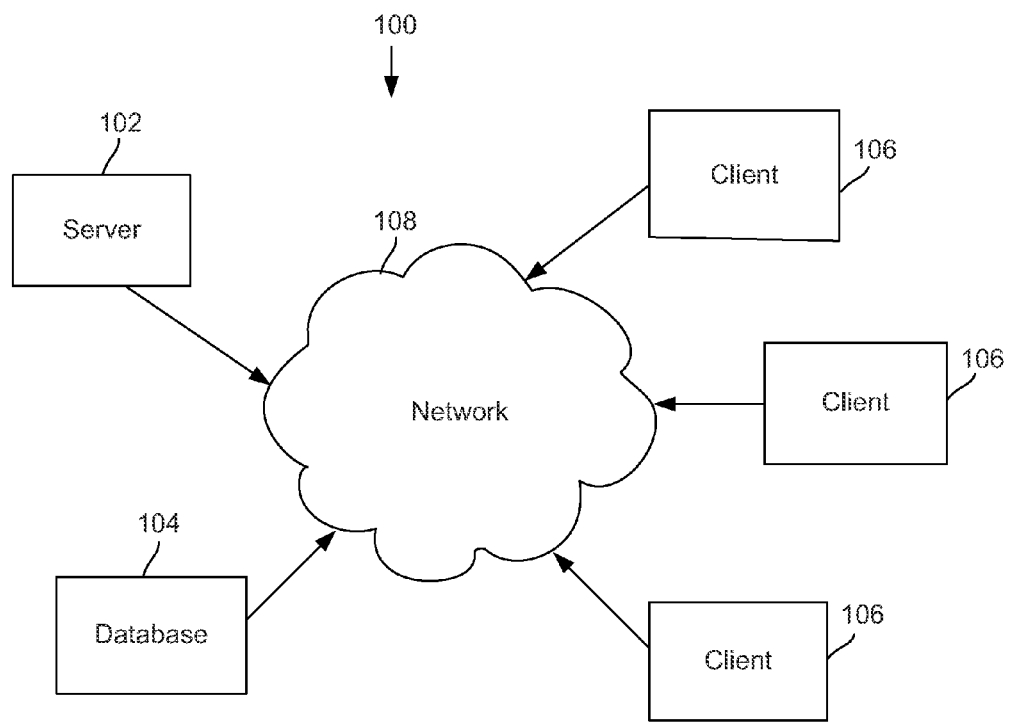
FIG. 1 illustrates an exemplary system for detecting memory access violations according to some embodiments.

The headings provided herein are for convenience only and do not necessarily affect the scope or meaning of the terms used.

DETAILED DESCRIPTION

Described in detail below is an apparatus and method for providing early detection of memory access violations occurring in simulations of device designs. A tool automatically intercepts transport function calls involving memory devices. The tool checks the memory address information pertaining to each transport function call against a memory map. Memory address information inconsistent with the address space specified in the memory map represents a memory access violation. Each violation can be reported for debugging purposes to facilitate device design correction or more accurate modeling of the device design.

The following description is presented to enable any person skilled in the art to create and use a computer system configuration and related method and article of manufacture to automatically check for memory access violations occurring in device simulations. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

Simulations permit modeling of systems in which components of a system are represented as modules, and communication between components are represented as transport function calls. A system may comprise a component on an integrated chip (e.g., a transistor, processor, bus, clock, memory, etc.), the entire integrated circuit (IC), an IC and other components, or otherwise one or more components of an electronic system. Simulation models aid in system or component design, prototyping, and/or testing.

The designer coding the simulation may specify the level of detail to which the simulation should reflect the corresponding physical system being modeled. For example, a system may be modeled at a transaction or event level, more granularly at a clock cycle level or across clock cycles, or at other levels of abstraction. An example of a discrete event simulation modeling is transaction level modeling (TLM 2.0) sponsored by Open SystemC Initiative (OSCI). One of the devices that can be modeled by TLM 2.0 is memory. TLM 2.0 permits creation of memory mapped bus models in which memory read and write operations are simulated. Memory read and write operations include passing memory address information as part of operating parameters.

A computer program tool configures a computer system to work in conjunction with simulation models to identify memory access violations occurring in simulated memory read and write operations. Although the tool is described in the context of TLM 2.0 designs, it should be understood that the tool is not limited to implementation with TLM 2.0. Instead, the tool may provide the automatic detection capability for a variety of simulation environments that pass address information as part of the modeling. For example, memory read/write operations may be modeled as C/C++ function calls independent of TLM 2.0.

FIG. 1 illustrates an exemplary system 100 for detecting memory access violations according to some embodiments. System 100 includes a server 102, a database 104, one or more clients 106, and a network 108. Each of server 102, database 104, and clients 106 is in communication with network 108.

Server 102 comprises one or more computers or processors configured to communicate with clients 106 via network 108. Server 102 may be located at one or more geographically distributed locations. Server 102 hosts one or more applications accessed by clients 106 and/or facilitates access to the content of database 104. Database 104 comprises one or more databases configured to communicate with server 102 and/or clients 106 via network 108. Although not shown, database 104 may also communicate with server 102 without needing network 108. Database 104 may be located at one or more geographically distributed locations from each other and also from server 102. Alternatively, database 104 may in included within server 102. Database 104 comprises a storage device for storing data for use by server 102 and/or clients 106.

Each of clients 106 comprises a computer or other computing device, including but not limited to, work stations, personal computers, general purpose computers, Internet appliances, hand-held devices, wireless devices, portable devices, wearable computers, cellular or mobile phones, portable digital assistants (PDAs), smart phones, multi-processor systems, microprocessor-based or programmable consumer electronics, game consoles, set-top boxes, network PCs, mini-computers, and the like. Clients 106 include applications (e.g., web browser application such as Internet Explorer, Firefox, Safari, etc.) or other necessary interface capabilities to communicate with server 102 and database 104 via network 108. Clients 106 may be located geographically dispersed from each other, server 102, and/or database 104. Although three clients 106 are shown in FIG. 1, more or less than three clients may be included in system 100. Device designers access a discrete event simulator and memory access violation detection tool via clients 106.

Network 108 comprises a communications network, such as a local area network (LAN), a wireless LAN (WLAN), a wide area network (WAN), a wireless WAN (WWAN), a metropolitan area network (MAN), an ad hoc network, an intranet, an extranet, a virtual private network (VPN), a portion of the Internet, the Internet, a portion of a public switched telephone network (PSTN), a cellular network, another type of network, or a combination of two or more such networks. When network 108 comprises a public network, security features (e.g., VPN/SSL secure transport) may be included to ensure authorized access within system 100.

The discrete event simulator and the detection tool may be hosted by the same component or different components within system 100. In one embodiment, the discrete event simulator and the detection tool are hosted on server 102 and they are remotely accessed by clients 106 via network 108. In another embodiment, the discrete event simulator and the detection tool reside locally on clients 106. Server 102 may be involved for purposes of updating and/or monitoring the simulator or detection tool on clients 106. Server 102 may also facilitate interaction with database 104 by clients 106. In still another embodiment, each of the simulator or detection tool may reside partly in each of server 102 and clients 106. Moreover, the detection tool and the discrete event simulator need not be hosted at the same component, e.g., server 102 hosts the detection tool and clients 106 hosts the simulator, or server 102 hosts the simulator and clients 106 hosts the detection tool.

Alternatively, clients 106 may be standalone stations not connected to a network. In this case, database 104 (or similar functionality) may be included in clients 106 to provide information used by the detection tool, as described in detail below.

As will be described in detail below, the detection tool does not require modifications to the discrete event simulation, or other integration between the simulation and the detection tool. The detection tool is configured to provide memory access violation detection automatically upon evoking the tool.

Figure 2:
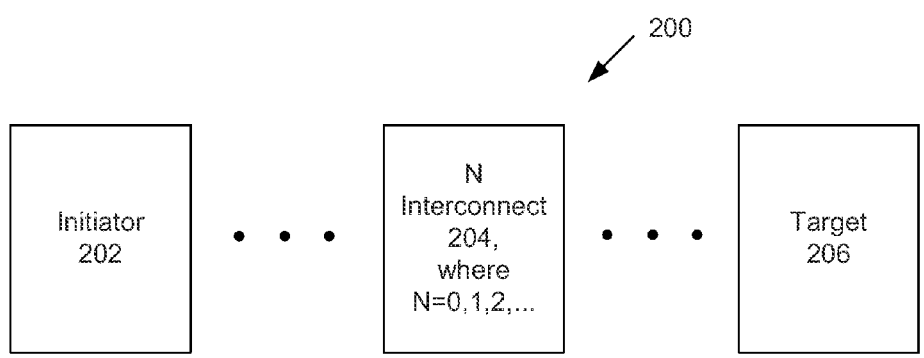
FIG. 2 illustrates exemplary modules of a discrete event simulation according to some embodiments.

FIG. 2 illustrates an information structure encoded in a computer readable storage device that includes exemplary modules 200 of a discrete event simulation according to some embodiments. A computer system or processor is configured to execute the information encoded in the computer readable storage device, including implementing the modules 200. In the TLM 2.0 specification, for example, components or devices of a modeled system are represented as modules and communication between modules are referred to as transport function calls. Modules typically come in three forms: initiators, targets, and interconnects. An initiator 202 is the module that initiates a transport function call. A target 206 is the module that is the destination of the transport function call initiated by initiator 202. In between initiator 202 and target 206 may be zero, one, or more interconnect 204 modules. Since interconnect 204 passes along the transport function call initiated by initiator 202 and intended for target 205, interconnect 204 itself qualifies as both an initiator and a target. Designation of a module as an initiator, target, or interconnect is not static. Depending on which module initiates a transport function call and/or the module pathway traversed by a transport function call, a given module may qualify as an initiator, target, or initiator module at different points in time.

When target 206 represents a model of a memory, transport function calls (also referred to as transport calls or transport functions) to target 206 represent read and write operations to and from memory. Such transport function calls are initiated by initiator 202 representing a processor or central processing unit (CPU). Exemplary interconnect 204 (if modeled in the chain of modules to the target) may comprise buses, routers, bridges, etc.

Figure 3A:
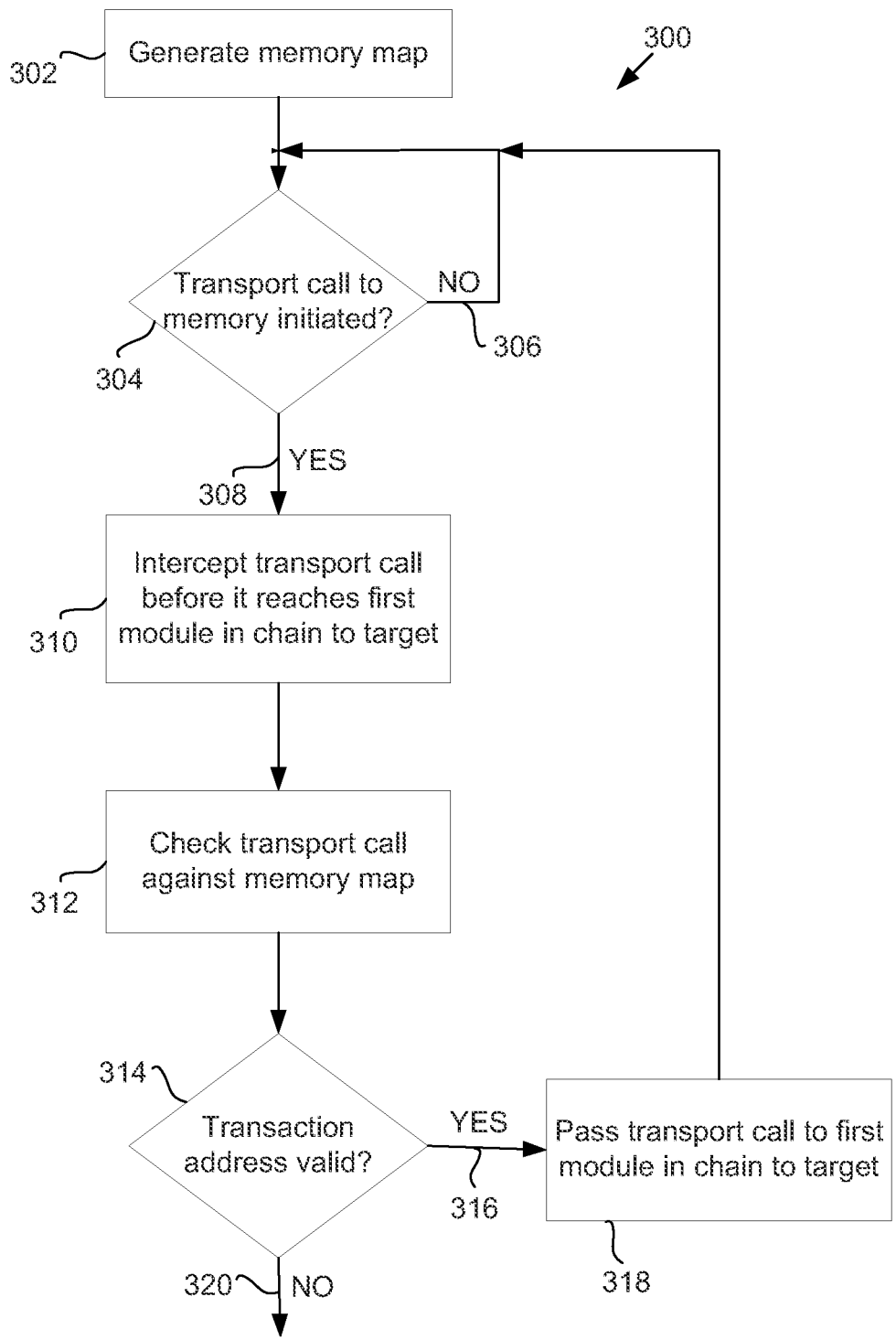

FIGS. 3A-3G illustrate exemplary flow diagrams for a tool that automatically detects memory access violations in discrete event simulations according to some embodiments. FIGS. 3A-3G will be described in conjunction with FIGS. 4-7. In FIG. 3A, a flow diagram 300 includes a generate memory map block 302, a transport call to initiated check block 304, an intercept transport call block 310, a memory map comparison block 312, a memory access violation check 314, and a pass transport call block 318.

At the generate memory map block 302, the designer (or other user) specifies an address space for each memory modeled within the discrete event simulation. In other words, the entire system address space is specified in a memory map. The memory map can be expressed as a text file, an XML file, or in any other suitable format recognized by the tool. The memory map may be stored in database 104 (FIG. 1) or locally at clients 106 when in a standalone configuration.

FIG. 4 illustrates an exemplary memory map 400 according to some embodiments. Memory map 400 defines the address space, in this example, for three memories 402: PROGRAM_MEMORY, MEMORY1, and MEMORY2. For each of these memories, a path 404 to the TLM 2.0 socket that implements the respective memory is specified. Additionally for each of the listed memories, its low address 406, high address 408, and base address 410 are provided, which collectively define a particular addressable memory region for each memory. The low and high addresses define the maximum address range for a given memory. The corresponding base address defines the reference point address from which all addresses for that memory (within the address range) are specified. For example, the base address may define the lowest possible address location for the memory, and the address of the fifth address location for the memory may be derived as the base address plus five.

Once a memory map has been defined, the detection tool is configured to look for initiation of a transport function call involving a target memory (block 304). In TLM 2.0 designs, there are typically three types of transport function calls: b_transport, nb_transport_fw, and nb_transport_bw. Calls to b_transport are made to emulate blocking read or write operations. Calls to nb_transport_fw and nb_transport_bw are made to emulate non-blocking read or write operations. Block 304 monitors the simulation for any of these transport function calls.

If no transport function call involving a memory has been initiated (no branch 306), then the detection tool continues to wait for a call initiation. Otherwise, if a call has been initiated (yes branch 308), then the detection tool is configured to intercept the initiated transport function call before it passes to the first module in the chain of modules to the target (block 310). In other words, intercept the function call before information included in or pertaining to the function call could be changed or transformed. For example, the address included in the function call could be modified or transformed by one or more interconnects in the chain of modules to the target. Because of this possible address modification, configuring the detection tool to intercept the function call after passing to a first module (or later module) in the chain of modules to the target is generally undesirable.

Figure 5A:
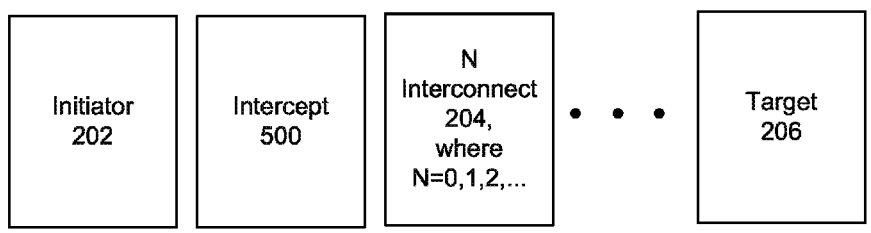
FIGS. 5A-5B illustrates exemplary intercepting modules according to some embodiments.

The detection tool "intercepts" the transport function call in any number of ways as long as it is able to examine the contents of the transport function call in order to check for memory access violation as described below. In one embodiment, intercept block 310 comprises a create intercept module block 310a and an insert intercept module between the initiator and the first module in the chain of modules to the target block 310b (FIG. 3F). FIG. 5A correspondingly illustrates intercepting by automatically creating and inserting an intercept module 500 (also referred to as an intermediate block) between initiator 202 and the first module in the chain of modules to the target 206. Intercept module 500 accepts the transport function call initiated by initiator 202 to perform the check and then passes the call to the first module in the chain of modules to the target 206.

Figure 3E:
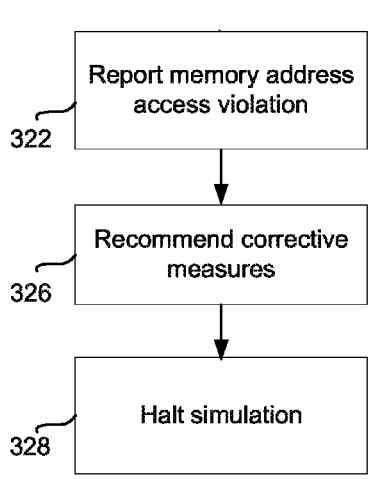
Figure 3F:
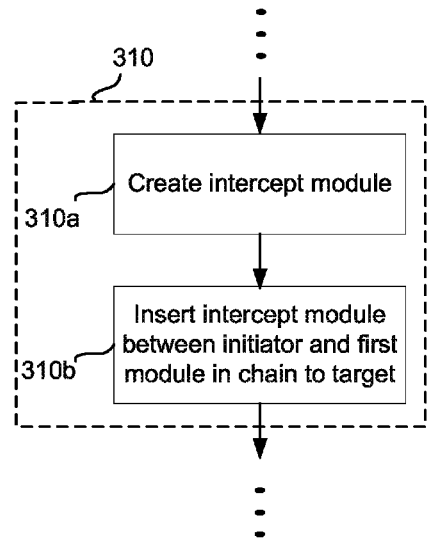
Figure 3G:
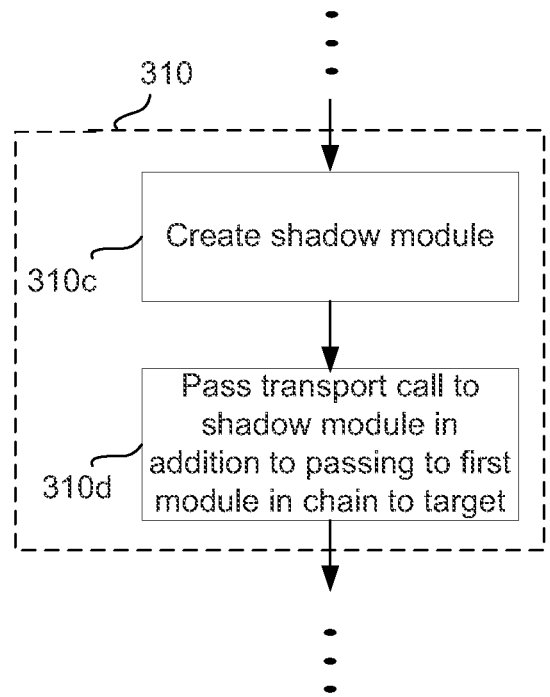
Figure 5B:
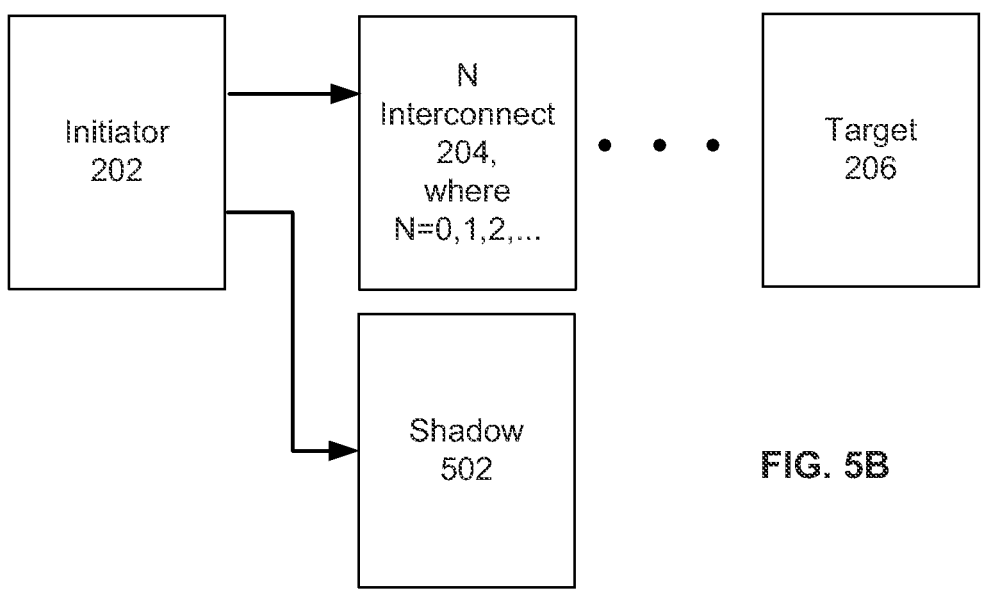

In another embodiment, intercept block 310 comprises a create shadow module block 310c and a pass transport call to the shadow module and first module in the chain of modules to the target block 310d (FIG. 3G). FIG. 5B illustrates this form of interception, in which an automatically created shadow module 502 receives from the initiator 202 the transport function call initiated by initiator 202 to perform the check. The transport function call also (normally) passes to the first of interconnect modules 204 (e.g., the first module in the chain of modules to target 206). The transport function call may be passed simultaneously or sequentially to each of shadow module 502 and the first of interconnect modules 204 from initiator 202. The shadow module 502 performs the memory address violation check independent of activities occurring within the regular modules. Because the transport function call has already been passed to interconnect module 204, shadow module 502 need not pass the transport function call again to interconnect module 204 (i.e., passing blocks 318 and 324 in FIGS. 3A, 3C, and 3D can be omitted).

In still another embodiment, intercept block 310 comprises execution of an application programming interface (API) included in the code base of the discrete event simulation model. An API of function calls may be provided to designers. During coding of the simulation model, the designer may insert the provided API into their code just before and after the point at which a transport function call would be initiated by an initiator. Consequently, during runtime of the simulation model, the API causes the transport function call to be passed to the detection tool. The detection tool performs the memory address violation check independent of activities occurring within the regular modules. Since the transport function call passes normally to the first module in the chain of modules to the target, there is no need to pass the transport function call again to the first module in the chain (i.e., passing blocks 318 and 324 in FIGS. 3A, 3C, and 3D can be omitted).

Next at block 312, one or more parameters passed to the intercepted transport function call is examined and checked against the memory map previously generated (see block 302). The detection tool looks for the memory address field(s) passed to the transport function call and compares the contents of those field(s) against the memory map associated with the intended target memory. The detection tool takes advantage of standard fields or parameters in discrete event simulation specifications to extract the necessary address information to perform the check. For example, in TLM 2.0 designs, each transport function call involving a target memory (which are read and write operations to and from memory) includes, among other things, a TLM 2.0 generic payload object as one of its parameters. FIG. 6 shows a table providing the fields of the TLM 2.0 generic payload object. In the case of TLM 2.0 simulations, the contents of the m_address field (representing the transaction address of the target memory involved in the transaction) and the m_length field (representing the number of bytes being read or written) of the generic payload object are examined. In other words, the detection tool intercepts each function call (e.g., b_transport, nb_transport_bw, and nb_transport_fw function calls in the case of TLM 2.0 designs) to examine the contents of the m_address and m_length fields of its generic payload object.

As an example, consider the following TLM 2.0 code snippet of an exemplary transport function call from an initiator CPU, making a call to read 64 bytes from memory address 0x50000:

```
. . . .
    trans.set_command    (TLM_READ_COMMAND);
//Specifies a read operation
    trans.set_address (0x50000); //This transaction address is a
memory violation compared to the addresses specified in the
memory map of FIG. 4
    trans.set_data_ptr  (reinterpret_cast<unsigned  char*>
(&data));
    trans.set_length (64); //Specifies 64 bytes
    socket→b_transport (trans, zerotime);
. . . .
```

Examining the contents of the trans.set_address and trans.set_length fields above, it can be seen that the transaction address lies outside of any of the memory regions specified in the memory map. Thus, the memory access specified in the transport function call qualifies as an access violation.

If the transaction address and transaction length in the generic payload object lie within any of the memory regions provided in the memory map (block 314), then the access is deemed to be valid (yes branch 316). Otherwise, if the transaction address or transaction length in the generic payload object lies outside any of the memory regions provided in the memory map (block 314), then the access is deemed to be invalid and a memory access violation has been detected (no branch 320).

In the case of a valid access detection (yes branch 316), the transport function call that was intercepted to perform the check can be passed (from intercept module 500) to the first module in the original chain to the target memory (block 318). The detection tool continues to monitor transport function calls to provide memory access violation detection.

In the case of an invalid access detection (no branch 320), the detection tool is robust enough to handle the detection information in any one or more of the following ways: provide violation detection notification, permanently interrupt the transport function call containing the violation, halt the simulation, and/or provide corrective guidance. Such detection information is provided to the designer via a display, printout, storage device, or the like.

In one embodiment, a statement can be provided to a user informing him or her that a memory access violation has occurred in the simulation (block 322). The statement can be provided as soon as the violation is detected, e.g., in real- or near real-time, or at a later point in time. The violation detection notification may be a stand-alone statement or a part of a larger report pertaining to the performance of the simulation. As shown in FIG. 3B, the transport function call containing the violation need not be passed to the target (since the transaction cannot be completed anyway due to the out-of-range address information specified). The tool may continue monitoring other transport function calls for access violations.

In another embodiment, the reporting function of block 322 can be performed before, simultaneous, or after passing the transport function call from the intercept module 500 to the first module in the chain to the target (block 324 in FIG. 3C). Again, the tool continues to monitor other transport function calls for access violations.

In still another embodiment, in FIG. 3D, in addition to reporting the violation (block 322) and passing the transport function call (block 324), in any possible order relative to each other as discussed above, the detection tool can also provide recommendations for corrective measures to prevent future access violations (block 326). Corrective recommendations may include more specificity regarding the violation (e.g., transaction address X in field Y is out of range) and/or instructions to correct specific lines of code (and how to correct the code) to prevent future access violations. Such corrective recommendations may similarly be provided in any order or simultaneously relative to blocks 322 or 324.

Lastly as shown in FIG. 3E, yet still another embodiment may involve the detection tool reporting the violation (block 322) and providing corrective recommendations (block 326)-again in any order or simultaneously relative to each other—and halting the simulation (block 328). It may be the case that the memory access violation detected in a transport function call has a cascading effect on the continuing simulation. Cascading effects may encompass the simulation crashing, introduction of errors into subsequent operations making it more difficult to identify the actual source of the error, or other unintended side effects. In such cases, it may be beneficial to halt the simulation as soon as a violation is detected so that the designer can address the problem before continuing with the rest of the simulation.

Although passing the transport function call to the first module in the chain to the target is shown occurring after blocks 310, 312, and 314 in FIG. 3A, it is understood that the passing function may occur simultaneously with any of blocks 310, 312, or 314. Moreover, depending on the method by which the transport function call was intercepted (block 310), these passing blocks may be omitted as discussed above.

Memory map 400 of FIG. 4 pertains to a multi-memory system. The detection tool is equally effective for a multi-initiator system. In a multi-initiator system, each initiator accesses the same or a different region(s) of memory(s) from other initiators. Each initiator can thus be associated with a unique address map or memory subsystems.

FIG. 7 illustrates a memory map 700 for a multi-initiator system in accordance with some embodiments. Two initiator processors—sc_main.processor0 and sc_main.processor2—access memory in the example system. Three target memories—ROM, RAM1, and RAM2—are accessed by each of the initiator processors. The five columns comprising memory map 700 provide information similar to that respectively provided in memory map 400 of FIG. 4. The top half of memory map 700 comprises an initiator subsystem map 702 for sc_main.processor0 and the bottom half comprises an initiator subsystem map 704 for sc_main.processor2.

For example, if sc_main.processor0 initiates a function call specifying transaction address 0x30000, a general memory violation check (as illustrated in FIG. 3A) would not detect a violation because transaction address 0x30000 lies within one of the memory regions specified in memory map 700. However, an access violation is detectable when the detection tool restricts the check to the particular initiator subsystem map corresponding to the particular initiator that initiated the function call. In this example, that would be initiator subsystem map 702 for sc_main.processor0. Thus, during simulation of a multi-initiator system, the detection tool is operable to perform more than one kind of memory violation check, or perform a more refined violation check taking into account the particular initiator that initiated the function call.

Continuing the example, a violation check specific to the initiator can be carried out as follows. In block 312 of FIG. 3A, the detection tool additionally obtains the name/identifier of the initiator (e.g., sc_main.processor0) in order to use the appropriate initiator subsystem map within memory map 700. The subsystem_instance name within memory map 700 (e.g., subsystem sc_main.processor0 in initiator subsystem map 702) that exactly matches the name/identifier of the initiator identifies the proper memory regions to check. If none of the subsystem instance names within memory map 700 matches the name/identifier of the initiator, either the first initiator subsystem map (or some other initiator subsystem map) or all of memory map 700 may be used to compare against the address information within the function call. Otherwise the rest of the discussion above for FIGS. 3A-3E is applicable when performing a violation check for a multi-initiator system.

Although several embodiments are discussed above for using the violation detection information, other additional or different uses may also be implemented. As appreciated by one skilled in the art, detection of a specific error in a complex system, in of itself, is of great value in correcting the error, especially when the detection is automatic, transparent to the end user, and may be provided in real- or near-real time. A user designing, coding, or running a discrete event simulation need not be concerned with factoring in the detection tool into the simulation (e.g., someone coding the models does not need to write special code to perform the check). Instead, the detection tool provides automatic and seamless debugging capability.

In this manner, an automatic detection tool is provided for systems modeled in discrete event simulations. The detection tool is configured to perform a violation check for each memory read or write operation simulated in a modeled system. The detection tool is capable of handling modeled systems that implement one or more target memories and/or one or more initiator processors. The detection tool integrates seamlessly with discrete event simulators, without requiring additional or special inputs or consideration by designers and others involved in setting up/running the simulations.

Figure 8:
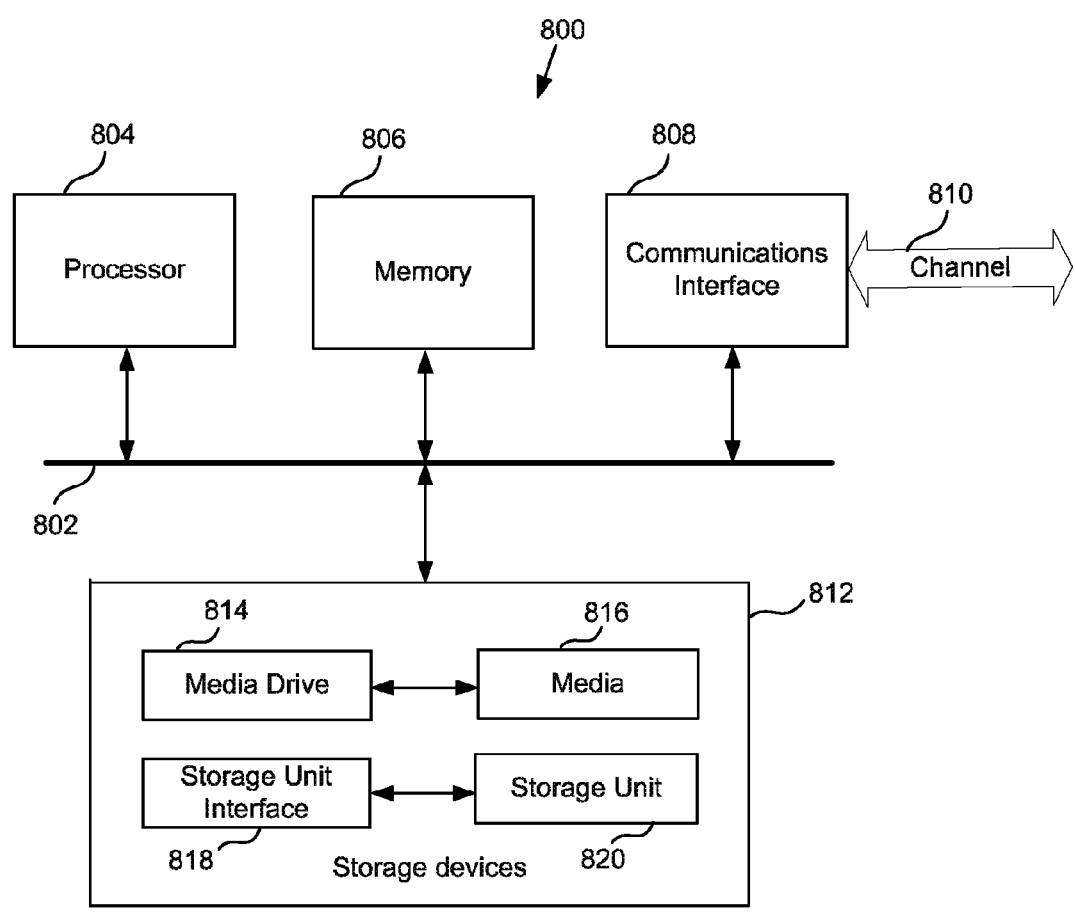
FIG. 8 illustrates a computing system that may be employed to implement processing functionalities in accordance with some embodiments.

FIG. 8 illustrates an exemplary computing system 800 that may be used to implement processing functionalities (e.g., the detection tool) according to some embodiments. Computing system 800 may be used in server 102 and clients 106 (FIG. 1). Those skilled in the relevant art will also recognize how to implement the invention using other computer systems or architectures. Computing system 800 can represent, for example, a desktop, laptop or notebook computer, hand-held computing device (PDA, cell phone, smart phone, tablet, etc.), mainframe, server, client, or any other type of special or general purpose computing device as may be desirable or appropriate for a given application or environment. Computing system 800 can include one or more processors, such as a processor 804. Processor 804 can be implemented using a general or special purpose processing engine such as, for example, a microprocessor, microcontroller or other control logic. In this example, processor 804 is connected to a bus 802 or other communication medium.

Computing system 800 can also include a main memory 805, such as random access memory (RAM) or other dynamic memory, for storing information, code, software, data, and/or instructions to be executed by processor 804. Main memory 806 can also be used for storing temporary variables or other intermediate information during execution of instructions to be executed by processor 804. Computing system 800 may likewise include a read only memory (ROM) or other static storage device coupled to bus 802 for storing static information and instructions for processor 804.

Computing system 800 can additionally include a storage system 812, which may include, for example, a media drive 814 and a removable storage interface 818. The media drive 814 may include a drive or other mechanism to support fixed or removable storage media, such as a hard disk drive, a floppy disk drive, a magnetic tape drive, an optical disk drive, a CD or DVD drive (R or RW), thumb drive, or other removable or fixed media drive. Storage media 816 may include, for example, a hard disk, floppy disk, magnetic tape, optical disk, CD or DVD, thumb drive, or other fixed or removable medium that is read by and written to by media drive 814. Storage media 816 may include a computer-readable storage medium that stores particular computer software, instructions, code, and/or data.

In alternative embodiments, storage system 812 may include other similar components to allow computer programs or other instructions or data to be loaded in and/or executed by computing system 800. Such components may include, for example, a removable storage unit 820 and a storage unit interface 818, such as a program cartridge and cartridge interface, a removable memory (for example, a flash memory or other removable memory module) and memory slot, and other removable storage units 820 and interfaces 818 that allow executable instructions and data to be transferred from storage media 816 to computing system 800.

Computing system 800 can also include a communications interface 808. Communications interface 808 also permits executable instructions and data to be transferred between computing system 800 and external devices. Examples of communications interface 808 includes a modem, a network interface (such as an Ethernet or other NIC card), a communications port (such as for example, a USB port), a PCMCIA slot and card, etc. Software and data transferred via communications interface 808 are in the form of signals which can be electronic, electromagnetic, optical, or other signals capable of being received by communications interface 808. These signals are provided to communications interface 808 via a channel 810. Channel 810 may carry signals and be implemented using a wireless medium, wire or cable, fiber optics, or other communications medium. Some examples of a channel include a phone line, a cellular phone link, an RF link, a network interface, a local or wide area network, and other communications channels 810 to perform features or functions of some embodiments.

The terms "computer program product," "computer-readable medium," and the like are used generally to refer to media such as memory 806, storage device 816, storage unit 820, server 102, database 104, or client 106. These and other forms of computer-readable media may be involved in storing one or more sequence of one or more instructions for use by processor 804, server 102, or client 106, to cause the processor to perform specified operations. Such instructions, generally referred to as "computer program code" (which may be grouped in the form of computer programs or other groupings), when executed, enable the computing system 800 to perform features or functions of some embodiments. Software, instructions, code, and/or data in computing system 800 may directly cause the processor to perform specific operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 800 using, for example, removable storage interface 818, drive 814 or communications interface 808. The control logic (in this example, software instructions or computer program code), when executed by the processor 804, causes the processor 804 to perform the functions of some embodiments as described herein.

It will be appreciated that, for clarity purposes, the above description describes some embodiments with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the claims. Additionally, although a feature may appear to be described in connection with particular embodiments, one skilled in the art would recognize that various features of the described embodiments may be combined in accordance with the invention.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather the feature may be equally applicable to other claim categories, as appropriate.

Moreover, it will be appreciated that various modifications and alterations may be made by those skilled in the art without departing from the spirit and scope of the invention. The invention is not to be limited by the foregoing illustrative details, but is to be defined according to the claims.

Although only certain exemplary embodiments have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A system, comprising:
a storage device encoded with an information structure that includes a chain of modules that represent components of an integrated circuit design and with a memory map, wherein the chain of modules includes a memory module that corresponds to the memory map; and
a computing device in communication with the storage device configured to run a simulation using the chain of modules and in the course of the simulation to,
intercept read or write operations occurring during the simulation in which the memory module acts as a target module prior to passing the read or write operations initiated from an initiator module within the chain to a first module, within the chain after the initiator module, to the target module, and
use the memory map to determine whether the read or write operation involves a memory access violation.

2. The system of claim 1, wherein the computing device is configured to detect an invalid memory address included in at least one of the intercepted read or write operations using the memory map.

3. The system of claim 2, wherein the memory address comprises at least one of a transaction address and a byte size of a transaction.

4. The system of claim 1, wherein the initiator module comprises a processor component the target module comprises a memory component, and modules within the chain between the initiator module and the target module comprise zero, one, or more number of components.

5. The system of claim 1, wherein the computing device is configured to insert a new module between the initiator module and the first module in the chain between the initiator module and the target module to intercept read or write operations.

6. The system of claim 1, wherein the computing device is configured to transmit the read or write operations from the initiator module to each of a new module and the first module in the chain between the initiator module and the target module.

7. The system of claim 1, wherein the information structure encoded in the storage device includes at least one application program interface (API) for the computing device to intercept read or write operations during running of the simulation.

8. The system of claim 1, wherein the computing device is configured to present notification of the detected memory access violation.

9. The system of claim 1, wherein the computing device is configured to interrupt at least one of the read or write operations in response to the detected memory access violation.

10. The system of claim 1, wherein the computing device is configured to halt the simulation in response to the detected memory access violation.

11. The system of claim 1, wherein the computing device is configured to present at least one recommendation to change the information structure encoded in the storage device in response to the detected memory access violation.

12. The system of claim 1, wherein the computing device includes a display to present information pertaining to the detected memory access violation.

13. The system of claim 1, further comprising a second computing device in communication ,with at least the computing device,
wherein the automatic detection of the memory access violation is remotely accessed by the second computing device from the computing device.

14. The system of claim 1, wherein the memory map includes a pathway to the memory, a low address for the memory, a high address for the memory, and a base address for the memory.

15. The system of claim 1, wherein the simulation includes at least two processor components, each of the processor components accessing a portion of a memory component, and the memory map includes a subsystem map for each of the processor components.

16. A method for detecting memory access violation, the method comprising:
    monitoring, using at least one processor, a simulation of a system that includes at least one memory, for a transport function call involving the memory;
    intercepting, using the processor, address information pertaining to the transport function call; and
    performing, using the processor, a memory access violation check using the address information and a memory map associated with the memory, wherein the memory map specifies an address space for the memory.

17. The method of claim 16, wherein intercepting the address information comprises obtaining the address information before the transport function can passes from an initiator module to a first module in a chain of modules to a target module, wherein the initiator module initiates the transport function call, the target module comprises the memory, and the chain of modules comprises zero, one, or more number of modules between the initiator module and the target module.

18. The method of claim 16, wherein intercepting the address information comprises obtaining the address information passed to the transport function call without alteration.

19. The method of claim 18, further comprising presenting notification of a memory access violation when the memory access violation check detects a violation.

20. The method of claim 16, wherein performing the memory access violation check comprises using the address information and a portion of the memory map associated with an initiator that initiated the transport function call.

21. The method of claim 16, wherein the address information comprises a transaction address or a number of bytes in the transaction for the transport function call.

22. The method of claim 16, wherein the transport function call comprises a memory read or write operation.

23. The method of claim 16, wherein the simulation comprises a discrete event simulation.

24. The method of claim 16, wherein the simulation comprises a transaction level modeling standard (TLM) 2.0 simulation.

25. The method of claim 16, further comprising generating the memory map prior to monitoring the simulation.

26. A non-transitory computer readable medium including instructions, when executed by a processor, causes the processor to perform acts comprising:
    intercepting information pertaining to a transport function call initiated by an initiator in a simulation before the information is potentially transformed as the transport function call passes to a next module in a chain of modules to a target;
    comparing the intercepted information with a memory address space;
    detecting a memory access violation in the simulation based on the comparison of the intercepted information with the memory address space; and
    presenting the detected memory access violation.

27. The computer readable medium of claim 26, further comprising:
    automatically monitoring the simulation for initiation of any transport function call involving a memory.

28. The computer readable medium of claim 26, wherein the simulation comprises a discrete event simulation.

29. The computer readable medium of claim 26, wherein the simulation comprises a transaction level modeling standard (TLM) 2.0 simulation.

30. The computer readable medium of claim 26, wherein intercepting the information comprises intercepting the transport function call before possible alteration from the next module in the chain of modules between the initiator and the target.

31. The computer readable medium of claim 26, further comprising extracting at least one of a transaction address and a number of bytes of a transaction from the transport function call.

32. The computer readable medium of claim 31, wherein detecting the memory access violation comprises at least one of the transaction address and the number of bytes of the transaction being out of range with the memory address space.

33. The computer readable medium of claim 26, wherein the next module in the chain of modules to the target comprises zero, one, or more modules.

\* \* \* \* \*